United States Patent
Zaal et al.

(10) Patent No.: US 7,327,438 B2
(45) Date of Patent: Feb. 5, 2008

(54) LITHOGRAPHIC APPARATUS AND METHOD OF A MANUFACTURING DEVICE

(75) Inventors: Koen Jacobus Johannes Maria Zaal, Eindhoven (NL); Tjarko Adriaan Rudolf Van Empel, Eindhoven (NL); Aschwin Lodewijk Hendricus Johannes Van Meer, Roosendaal (NL); Jan Rein Miedema, Eindhoven (NL); Joost Jeroen Ottens, Veldhoven (NL)

(73) Assignee: ASML Netherlands B.V., Veldhoven (NL)

(*) Notice: Subject to any disclaimer, the term of this patent is extended or adjusted under 35 U.S.C. 154(b) by 665 days.

(21) Appl. No.: 10/840,797

(22) Filed: May 7, 2004

(65) Prior Publication Data

US 2005/0002010 A1     Jan. 6, 2005

(30) Foreign Application Priority Data

May 9, 2003   (EP)   ................. 03076400

(51) Int. Cl.
*G03B 27/60*   (2006.01)
*G03B 27/42*   (2006.01)
*G03B 27/58*   (2006.01)
*H01T 23/00*   (2006.01)

(52) U.S. Cl. ............... 355/73; 355/53; 355/72; 361/234

(58) Field of Classification Search ............ 355/53, 355/72, 73, 75, 77; 361/234; 269/20
See application file for complete search history.

(56) References Cited

U.S. PATENT DOCUMENTS

| | | | |
|---|---|---|---|
| 4,551,192 A | * | 11/1985 | Di Milia et al. ........ 156/345.51 |
| 5,229,872 A | | 7/1993 | Mumola |
| 5,296,891 A | | 3/1994 | Vogt et al. |
| 5,523,193 A | | 6/1996 | Nelson |
| 5,669,977 A | | 9/1997 | Shufflebotham et al. |

(Continued)

FOREIGN PATENT DOCUMENTS

EP     0 298 564 A1     1/1989

(Continued)

OTHER PUBLICATIONS

Japanese Official Action issued for Japanese Patent Application No. 2004-138363, dated May 28, 2007.

(Continued)

*Primary Examiner*—Alan Mathews
(74) *Attorney, Agent, or Firm*—Pillsbury Winthrop Shaw Pittman LLP (57) ABSTRACT

A lithographic projection apparatus having a radiation system for providing a projection beam of radiation; a support structure for supporting a patterning device, the patterning device serving to pattern the projection beam according to a desired pattern; a substrate holder for holding a substrate the substrate holder provided with a device to provide a holding force for pressing the substrate against the substrate holder; a releasing structure constructed and arranged to eject the substrate from the holder against the holding force; and a projection system for projecting the patterned beam onto a target portion of the substrate. The lithographic projection apparatus may include a controller for controlling the releasing structure so as to release the substrate from the holder with a release force that is reduced prior to final release.

19 Claims, 5 Drawing Sheets

U.S. PATENT DOCUMENTS

| | | |
|---|---|---|
| 5,684,669 A | 11/1997 | Collins et al. |
| 5,923,408 A * | 7/1999 | Takabayashi ............... 355/53 |
| 5,956,837 A | 9/1999 | Shiota et al. |
| 5,969,441 A | 10/1999 | Loopstra et al. |
| 6,046,792 A | 4/2000 | Van Der Werf et al. |
| 6,184,972 B1 * | 2/2001 | Mizutani et al. ............. 355/72 |
| 6,215,642 B1 | 4/2001 | Sogard ..................... 361/234 |
| 6,307,620 B1 | 10/2001 | Takabayashi et al. |
| 6,496,350 B2 * | 12/2002 | Fujiwara .................... 361/234 |
| 2002/0141133 A1 | 10/2002 | Anderson et al. |
| 2002/0142492 A1 | 10/2002 | Fischer |
| 2003/0079691 A1 | 5/2003 | Shang et al. |

FOREIGN PATENT DOCUMENTS

| | | |
|---|---|---|
| EP | 1 118 425 A2 | 7/2001 |
| JP | 03-163848 | 7/1991 |
| JP | 09-027541 | 1/1997 |
| JP | 09-148419 | 6/1997 |
| JP | 11-69855 | 3/1999 |
| JP | 11-233601 | 8/1999 |
| JP | 11-260897 | 9/1999 |
| JP | 2002-246450 | 8/2002 |
| WO | WO98/33096 | 7/1998 |
| WO | WO98/38597 | 9/1998 |
| WO | WO98/40791 | 9/1998 |

OTHER PUBLICATIONS

European Search Report issued for European Patent Application No. 06076721.7-1226, dated Feb. 23, 2007.

* cited by examiner

LITHOGRAPHIC APPARATUS AND METHOD OF A MANUFACTURING DEVICE

The present invention claims priority from EP Application No. 03076400.5 filed May 9, 2003, the contents of which are incorporated herein by reference in its entirety.

FIELD

The present invention relates to a lithographic apparatus. The present invention also relates to a method of manufacturing a device.

The present invention also relates to a lithographic projection apparatus comprising a radiation system for providing a projection beam of radiation; a support structure for supporting a patterning device, the patterning device serving to pattern the projection beam according to a desired pattern; a substrate holder for holding a substrate said substrate holder provided with a clamp to provide a holding force for pressing the substrate against said substrate holder; releasing device constructed and arranged to apply a release force to release said substrate from said substrate holder against said holding force; and a projection system for projecting the patterned beam onto a target portion of the substrate.

RELATED ART

The term "patterning device" as here employed should be broadly interpreted as referring to devices that can be used to endow an incoming radiation beam with a patterned cross-section, corresponding to a pattern that is to be created in a target portion of the substrate; the term "light valve" can also be used in this context. Generally, the said pattern will correspond to a particular functional layer in a device being created in the target portion, such as an integrated circuit or other device (see below). Examples of such patterning devices include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired;

A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing a piezoelectric actuation device. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The matrix addressing can be performed using a suitable electronic device. In both of the situations described hereinabove, the patterning device can comprise one or more programmable mirror arrays. More information on mirror arrays as here referred to can be gleaned, for example, from U.S. Pat. No. 5,296,891 and U.S. Pat. No. 5,523,193, and PCT patent applications WO 98/38597 and WO 98/33096, which are incorporated herein by reference. In the case of a programmable mirror array, the said support structure may be embodied as a frame or table, for example, which may be fixed or movable as needed; and A programmable LCD array. An example of such a construction is given in U.S. Pat. No. 5,229,872, which is incorporated herein by reference. As above, the support structure in this case may be embodied as a frame or table, for example, which may be fixed or movable as needed.

For purposes of simplicity, the rest of this text may, at certain locations, specifically direct itself to examples involving a mask and mask table; however, the general principles discussed in such instances should be seen in the broader context of the patterning device as hereinabove set forth.

SUMMARY

Lithographic projection apparatus can be used, for example, in the manufacture of integrated circuits (ICs). In such a case, the patterning device or patterning structures may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion in one go; such an apparatus is commonly referred to as a wafer stepper or step-and-repeat apparatus. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, which is incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are needed, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, which is incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and the PCT application WO 98/40791, both of which are incorporated herein by reference.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid crystal display panels, thin film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet (UV) radiation (e.g. with a wavelength of 365, 248, 193, 157 or 126 nm) and extreme ultra-violet (EUV) radiation (e.g. having a wavelength in the range 5-20 nm), as well as particle beams, such as ion beams or electron beams.

In the conventional lithographic projection apparatus, during photolithographic processes, the wafer is firmly clamped on the wafer holder by a holding force, that may range from vacuum pressure forces, electrostatic forces, intermolecular binding forces or just gravity force. The wafer holder defines a substantially flat plane, usually in the form of a plurality of protrusions defining an even flat surface on which the wafer is clamped. Tiny variations in the height of these protrusions are detrimental to image resolution, since a small deflection of the wafer from an ideal flat plane orientation may result in rotation of the wafer and a resulting overlay error due to this rotation. In addition, such height variations of the wafer holder may result in height variation of the wafer that is supported thereby. During the photolithographic process, such height variations may affect image resolution due to a limited focal distance of the projection system. Therefore it is desirable to have an ideal flat wafer holder.

It has come to the attention of the inventors that this clamping force may cause problems when the wafer is released from the wafer holder.

A conventional ejection mechanism is arranged in a way to step up an release force to a substantially high level, thereby biasing the wafer in an initial biased configuration and then wait until the wafer is released from the wafer holder through conversion of this bias energy into a releasing action. For example, when a vacuum pressure is used as clamping force, the wafer is initially bent substantially away from the wafer holder at a central position of the wafer. Then, the wafer releases from the wafer holder through conversion of this bending energy to release action, while reducing the vacuum pressure to a substantial ambient pressure when the wafer is released from the wafer holder.

Usually, to provide such release force, a tripod of three ejection pins (e-pins) is used, which engage at three spaced apart locations of the wafer and provide a releasing force to disengage the wafer from the wafer holder. The energy that is built up in the wafer during this stepping up of the release force is converted into displacement by subsequent release of the wafer surface from the wafer holder surface. However, this built up energy may also cause damage to the wafer and or wafer holder.

The invention aims to overcome this problem by providing a photolithographic machine, wherein this problem is addressed and wherein the amount of energy left, when the wafer is finally released from the wafer holder, is not detrimental for the wafer and/or wafer holder.

This aspect is achieved by a lithographic projection apparatus according to the preamble, wherein the lithographic projection apparatus comprises a controller for applying a release force that is reduced preceding to final release.

In this way, since the release force, preceding to final release, is lowered by the controller, the amount of energy that may be damaging to the wafer and/or wafer holder, in particular the amount of energy acting on the holding region for holding the wafer in a flat position, is reduced in comparison with a constant release force, wherein the wafer releases from the wafer holder with a sudden movement and wherein, after release the release force is lowered drastically instead of a lowering thereof in advance of the final release moment.

By reduction of the release force during release, the amount of energy absorbed by the wafer is lowered, so that during the release thereof, this energy is not damaging to the wafer and/or wafer holder.

Preferably the release force is controlled such that the release force at final release is less then 70% of the maximum release force. Still more preferably, the release force is controlled relative to a preset release height of the releasing device. In particular, the difference between an actual wafer height near the e-pins and a preset release height is measured. This actual height of the wafer during release determines the maximum angle of rotation of the wafer, especially in the vicinity of the final release area where the substrate finally releases from the wafer holder and is dependent on the release force applied to the wafer during final release. By keeping the angle of rotation low, the maximum amount of energy to be transferred to the wafer holder is low, thereby keeping the wafer and/or wafer holder intact since the amount of energy is kept below a threshold value that is maximally absorbable.

In a preferred embodiment the preset height is chosen so as to generate a maximum angle of deflection of 2 mrad. Here, the preset height for a 200 mm wafer is smaller than 1.0 mm, preferably smaller than 0.5 mm. To absorb excess energy still left during the final release of the wafer from the wafer holder, preferably, the wafer holder comprises a protective rim for absorption of wear energy. In this way, the energy is absorbed by a zone of the wafer holder where the flatness is not crucial. Hence, in the photolithographic process, flatness can be maintained.

The invention further relates to a device manufacturing method comprising the steps of: providing a substrate that is at least partially covered by a layer of radiation-sensitive material; providing a holding force for pressing the substrate against a substrate holder; providing a projection beam of radiation using a radiation system; using a patterning device or a patterning structure to endow the projection beam with a pattern in its cross-section; projecting the patterned beam of radiation onto a target portion of the layer of radiation-sensitive material; and applying a release force so as to release the substrate from the substrate holder against the holding force. According to the invention, the method comprises the step of controlling the releasing device so as to apply a release force that is reduced preceding to final release.

Preferably, the release force and/or the release height are determined in-process in an iterative way. In this way, in a high-throughput photolithographic process, the amount of releasing force to be applied to the wafer can be easily and quickly found without causing unnecessary damage to the wafer holder.

Still more preferably, the release force and/or the release height are determined based on recently in-process applied release forces and/or release heights. Such recent results, for example, a statistical averaging of the last ten results, will offer the best heuristic values, while keeping the damage to the wafer to a minimum.

In a further aspect, the invention relates to a lithographic apparatus according to the preamble, wherein the substrate holder comprises a protective rim for absorption of wear energy. Such a protective rim absorbs any excess release energy left after release of the substrate from the substrate holder, while keeping the substrate holder itself intact.

In a still further aspect, the invention relates to a device manufacturing method comprising the steps of: providing a substrate that is at least partially covered by a layer of radiation-sensitive material; providing a holding force for pressing the substrate against a substrate holder; providing a projection beam of radiation using a radiation system; using a patterning device or a patterning structure to endow the projection beam with a pattern in its cross-section; projecting the patterned beam of radiation onto a target portion of the layer of radiation-sensitive material; applying a release force so as to release the substrate from the substrate holder against the holding force; and determining the release force and/or an release height in-process in an iterative way.

BRIEF DESCRIPTION OF DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
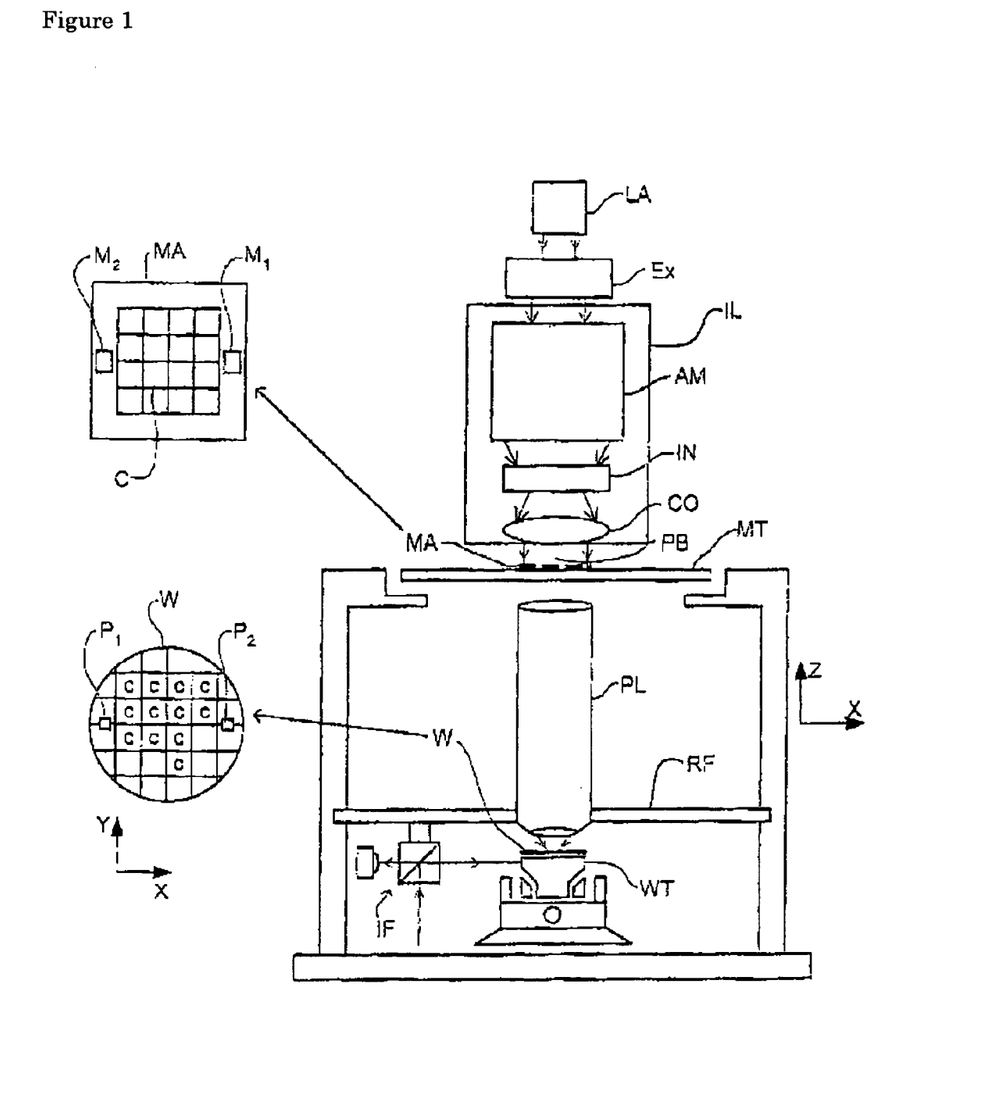
FIG. 1 depicts a lithographic projection apparatus according to an embodiment of the invention.

FIG. 1 schematically depicts a lithographic projection apparatus according to a particular embodiment of the invention. The apparatus comprises:

a radiation system Ex, IL, for supplying a projection beam PB of radiation (e.g. light in the deep ultraviolet region). In this particular case, the radiation system also comprises a radiation source LA;

a first object table (mask table) MT provided with a mask holder for holding a patterning device, illustrated in the form of the mask MA (e.g. a reticle), and connected to first positioning device PM for accurately positioning the mask with respect to item PL;

a second object table (substrate table) WT provided with a substrate holder for holding a substrate W (e.g. a resist coated silicon wafer), and connected to second positioning device PW for accurately positioning the substrate with respect to item PL; and a projection system ("lens") PL for imaging an irradiated portion of the mask MA onto a target portion C (e.g. comprising one or more dies) of the substrate W.

As here depicted, the apparatus is of a transmissive type (i.e. has a transmissive mask). However, in general, it may also be of a transmissive type, for example (with a transmissive mask). Alternatively, the apparatus may employ another kind of a patterning device or patterning structure, such as a programmable mirror array of a type as referred to above.

The source LA (e.g. an excimer laser source) produces a beam of radiation. This beam is fed into an illumination system (illuminator) IL, either directly or after having traversed a conditioning device, such as a beam expander Ex, for example. The illuminator IL may comprise an adjusting device AM for setting the outer and/or inner radial extent (commonly referred to as s-outer and s-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and claims encompass both of these scenarios The beam PB subsequently intercepts the mask MA, which is held on a mask table MT. Having traversed the mask MA, the beam PB passes through the lens PL, which focuses the beam PB onto a target portion C of the substrate W. With the aid of the second positioning device PW (and interferometric measuring device IF), the substrate table WT can be moved accurately, e.g. so as to position different target portions C in the path of the beam PB. Similarly, the first positioning device PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed. Mask MA and substrate W may be aligned using mask alignment marks M1, M2 and substrate alignment marks P1, P2.

The depicted apparatus can be used in two different modes:

1. In step mode, the mask table MT is kept essentially stationary, and an entire mask image is projected in one go (i.e. a single "flash") onto a target portion C. The substrate table WT is then shifted in the x and/or y directions so that a different target portion C can be irradiated by the beam PB; and 2. In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

During the photolithographic processes, the wafer 1 is firmly clamped on the wafer holder 2 by a holding force, that may range from vacuum pressure forces, electrostatic forces, intermolecular binding forces or just gravity force. The wafer holder 2 defines a substantially flat plane, in the form of a plurality of protrusions defining an even flat surface on which the wafer 1 is clamped.

Figure 2:
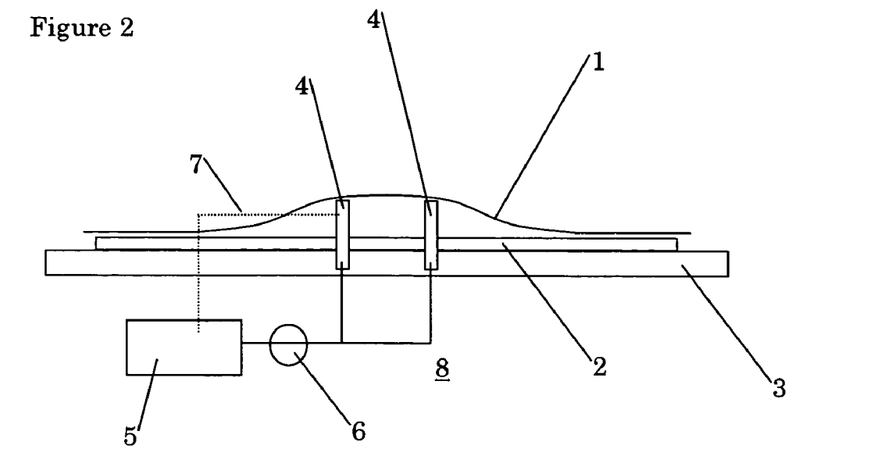
FIG. 2 depicts the initial stage of release of a wafer from a wafer holder in accordance with an embodiment of the invention.

In FIG. 2, an initial stage is shown, wherein a wafer 1 releases from a wafer holder 2. The wafer holder 2 comprises support pins (e.g. cylindrical burls, not shown) having a height of approximately 100 μm. The burls are spaced apart from each other at a distance of approximately 3 mm. The burls have a diameter of approximately 0.5 mm. Each protrusion has an extremity remote from the face of the substrate holder and is thus embodied (dimensioned) that the said extremities all lie within a single substantially flat plane. The wafer holder 2 may be supported on a flat support 3.

The wafer 1 is released from the holder 2 by ejection pins 4, usually three in number (of which only two are shown), which are controlled by a controller 5 that-controls the displacement of the ejection pins 4. Such a controller 5 may be a software routine, that controls the functioning of for example an electrical motor 6 that drives the ejection pins 4. In addition, the controller 5 may be implemented in hardware elements, for instance in a design that uses preconfigured digital and/or analog hardware elements that are responsive to certain detection inputs 7 of the ejection system 8. The shape of wafer 1 in FIG. 2 can be characterized as a bell shape, that is, in this stage, the wafer is only in the center region near the ejection pins released. The ejection pins provide an release force on the wafer, resulting in a biasing of the wafer 1 so that energy is stored in bending the wafer. The wafer 1 releases from the substrate holder in the central region, while the outer regions of the wafer 1 are still clamped to the substrate, due to a vacuum suction force.

Figure 3:
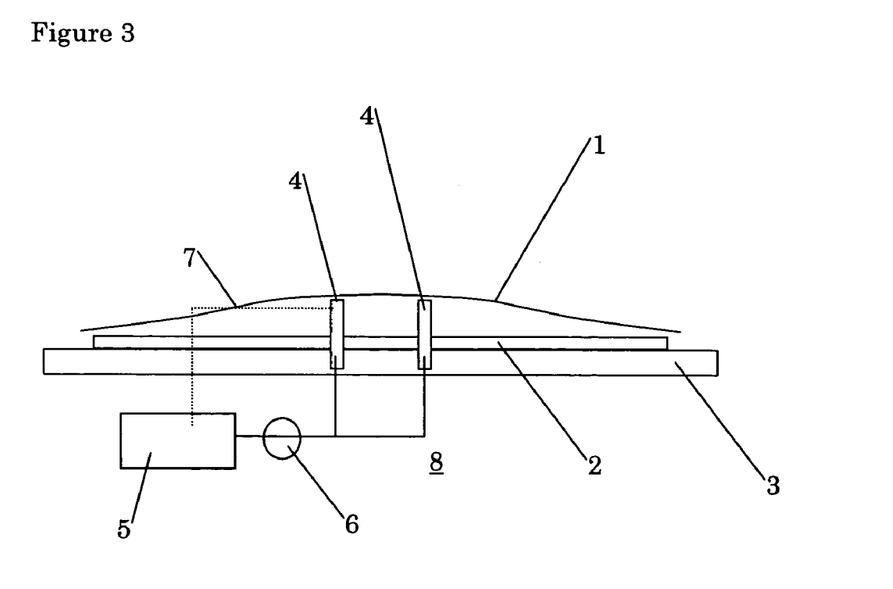
FIG. 3 depicts the final stage of release of a wafer from a wafer holder in accordance with an embodiment of the invention.

FIG. 3 shows a schematic view of the substrate 1 in the final stage of release. In this stage, the wafer has a "bowl" shape, that is, nearly all parts of the wafer 1 are released and there is only contact between the outer region of the wafer and the wafer holder. In this stage, the shape of the wafer is substantially convex, so that, as will be explained further with reference to FIG. 4, the wafer surface is slightly rotated with respect to the wafer holder. Such a rotation may introduce mechanical friction that potentially causes damage. The outer region in the example of FIG. 3 consists of only a few rings of concentric protrusions, or a sealing rim for creating a vacuum. The final release occurs when the wafer is rotated away from this outmost perimeter region of the wafer holder.

Figure 4:
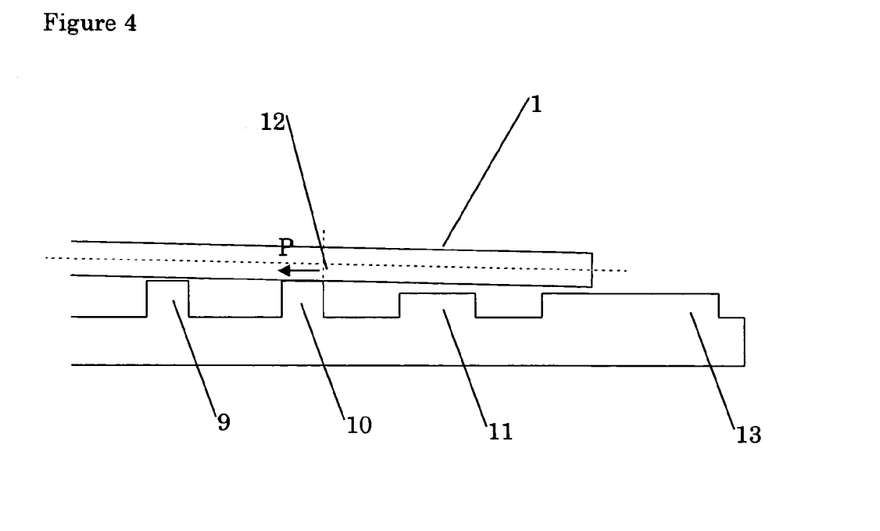
FIG. 4 depicts a detailed illustration of the wafer and the wafer holder in the final stage of release in accordance with an embodiment of the invention.

FIG. 4 shows a detailed view on the wafer 1 near the outmost perimeter region of the wafer holder 2 during release. In this example, the wafer holder 2 comprises a series of concentric burl rings, of which the second last burl ring 9 and last burl ring 10 are shown. Furthermore, the wafer holder 2 comprises a sealing rim 11. The rim 11 is dimensioned to provide a "leaking" seal, that is, due to the small difference in height of the rim 11 and the burls 9 and 10, air is able to enter the room formed between the burls. In this way, a clamp or holding force is generated that extends away from the center of the wafer up to the sealing rim, so that the substrate 1 is pressed substantially flat against the substrate holder 2. When the wafer 1 rotates when the second last burl ring 9 no longer has contact with the wafer 1, the wafer 1 will scrape across the point of contact 12. This scraping is caused by the fact that the central line on the wafer rotates, which forces the bottom surface to move into the direction of the centre of the wafer holder 2, illustrated by arrow P. The scraping distance is the rotation of the wafer multiplied by half the wafer thickness. The energy associated with the scraping effect can calculated as the product of force and displacement. The force is a friction force proportional to the vertical force generated between the wafer 1 and wafer holder 2 and will be maximal where the rotation of the wafer is maximal, hence near the boundaries of the wafer holder. Depending on the design of the wafer holder 2, the last point of contact may be the last burl ring 10, the outer rim 11 or even a further rim element 13 that may be used to absorb the scraping energy associated with the release action.

Figure 5:
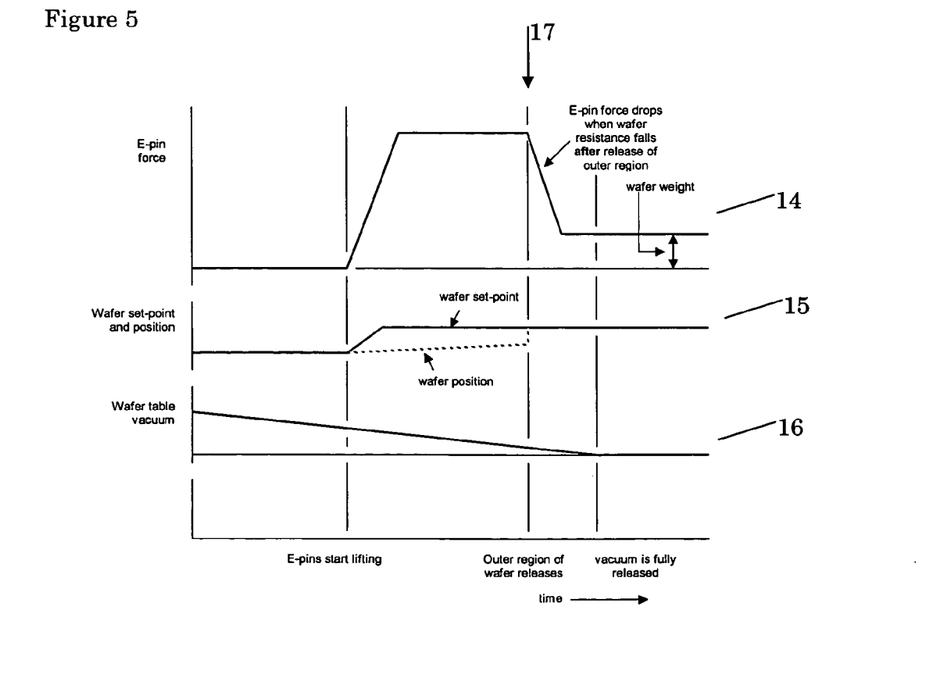
FIG. 5 depicts a conventional force-diagram of an ejection of a wafer from a wafer holder.

FIG. 5 depicts a conventional force-diagram of an ejection of a wafer from a wafer holder. In the diagram, three simultaneously occurring events are depicted: the upper line 14 illustrates a force applied on the substrate by the ejection pins; the medium line 15 illustrates a preset control curve of the wafer height in response to the application of said release force; the intermittent line just below medium line 15 illustrates the actual height of the wafer 1 in response to the application of said release force. The lower line 16 depicts the drop of the vacuum pressure (that is, the pressure difference to ambient pressure), which just after full release of the wafer drops to zero. In the diagram of FIG. 5, it becomes apparent, that the release force drops after the wafer has been fully release, to a level that is sufficient for supporting the wafer 1. In view of the discussion of the energy converted to scraping energy with reference to FIG. 4, in FIG. 5, it is apparent that the area below the force line 14 until the release moment 17 is equivalent to energy converted into release action; where the area below the force line 14 after release moment 17 is proportionate to scraping action and energy absorption near the boundary of the wafer holder 2; which may be damaging to the wafer 1 and/or wafer holder 2. Here, the release moment 17 may be characterized as the moments the outer region of the wafer starts to release, in particular, the second last burl ring 9, from the wafer holder 2. From this release moment 17 the wafer edge rotates around the perimeter of the wafer holder 2, in particular rim 11. It is an insight of the invention that the area of the force line after this release moment 17 should be minimized as much as possible, hence to release the substrate 1 from holder 2 with a release force that is reduced prior to final release.

Figure 6:
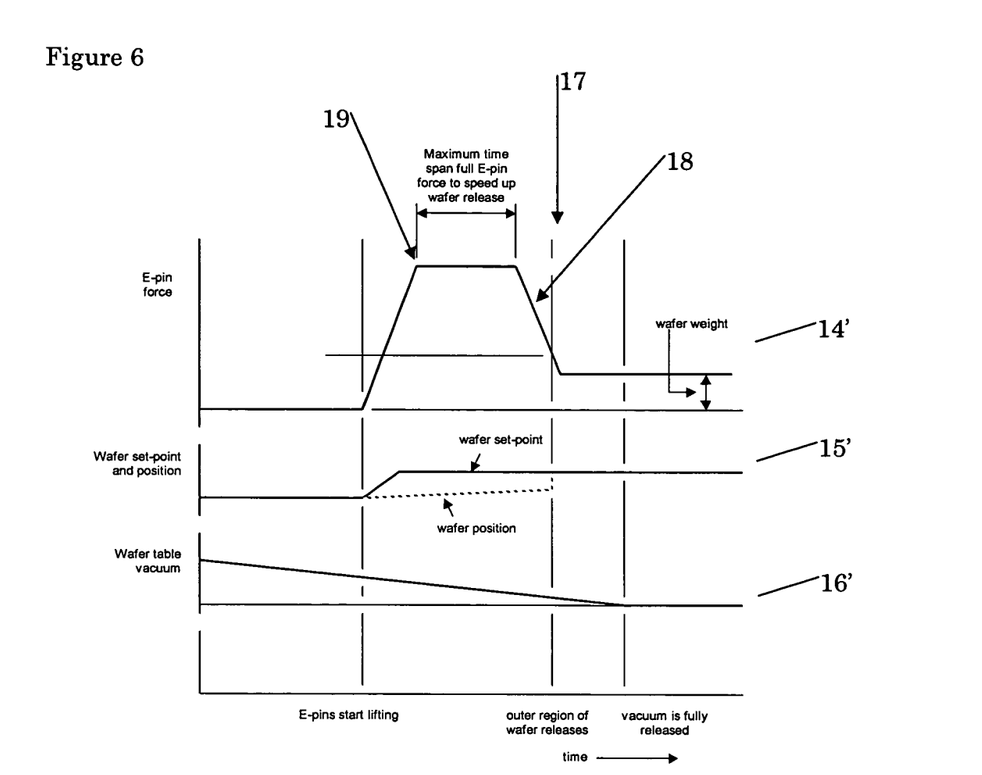
FIG. 6 depicts a modified force-diagram showing ejection control of the wafer according to embodiments of the invention.

FIG. 6 shows an illustrative diagram showing a force line 14' according to the invention. The force line is lowered prior to release, hence keeping the generated destructive energy to a minimum after release. Preferably, the lowering is controlled in a maximal steep descent 18, thus applying maximum power while releasing the wafer, thus shortening the release time of the wafer. This results ideally in a force-characteristic substantially according to a block shape: Initially, the force is stepped up high to a clipping edge 19 to provide a maximum thrust, thereby releasing the wafer as soon as possible. The wafer height is preset to a predetermined set-point 15, which is determined so that the wafer is released when set-point height is reached. The actual wafer height near the ejection pins is entered into a controller 5, which determines, based upon a difference analysis between set-point height and actual height the release force to be applied relative to said preset release height of the ejection pins. This difference analysis may include a term proportional to the difference between set-point and actual height, plus time-integrated and time-differentiated terms of this actual difference.

Figure 7:
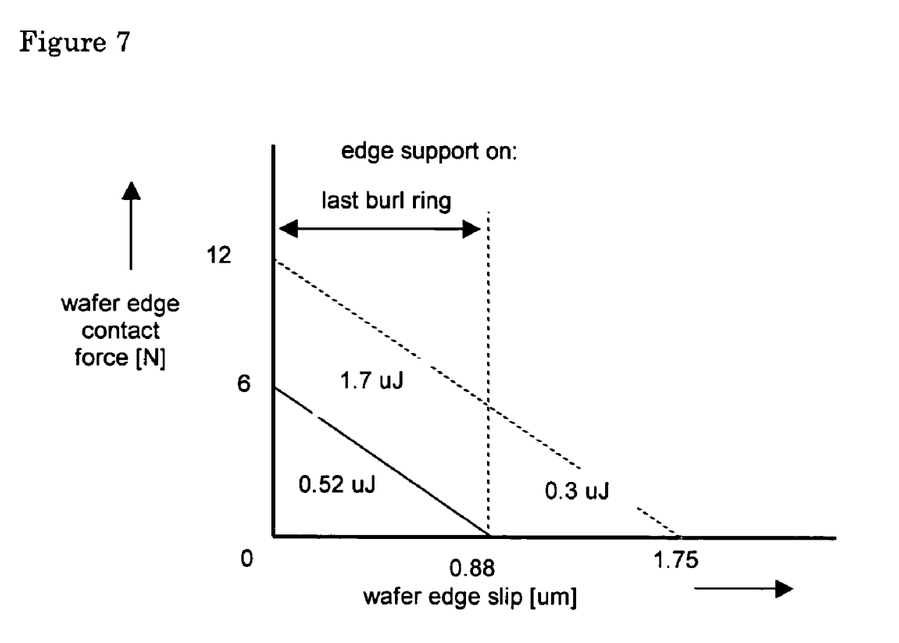
FIG. 7 depicts an illustration of the energy absorbed by the wafer holder during the final stage of release in accordance with an embodiment of the invention.

FIG. 7 depicts a schematic estimate of the energy that is generated in the final stages of the release action of the wafer, for a 200 mm wafer of 0.7 mm thickness with a Young's modulus of 190 GPa. In this estimate, the applied vacuum pressure was 0.5 bar where the E-pin force applied was 12 N. In this situation it was found that when pressure is kept at 7 mbar, the wafer will just release from the second last burl ring 9 while still being supported by the final burl ring 10, hence form a stable condition. Between 7 and 3.5 mbar, the wafer will rotate about the outer support point. At 3.5 mbar, the vacuum pressure will have become to low to keep the wafer pushed onto the last burl. The wafer will then release from the table, and the E-pin force will become equal to the wafer weight. To find a quantitative measure for wear energy, the following information is needed: normal contact force; slip force, from coefficient of friction and normal contact force; and slip distance from wafer rotation.

For an applied e-pin force of 12 N, the wafer edge contact force on the last burl ring was found to be also 12 N at the start of the bowl shape part of the process. The wafer rotation at the end of the bowl shape was found to be 5 mrad. The coefficient of friction is assumed to be 0.2 here. FIG. 7 shows the relation between contact force and wafer rotation: while the wafer rotates to 5 mrad, the contact force drops from 12 N to zero. At 1 mm outside the last burl ring, the wafer will deflect over 5 um for a 5 mrad rotation. With the vacuum seal at 3 um below the burls, the vacuum seal will become point of contact at 60% of the rotation process. It may be appreciated that varying the height of the outer rim will affect the amount of energy that is transferred on either the outer ring of burls 10 or the sealing rim 11. Hence, in the example where the sealing rim 11 is 3 um below the outer ring of burls 10, 60% of the friction energy is consumed by the outer burl ring 10, and 40% is consumed by the sealing rim 11.

In a routine for calculating the friction energy for a 6 N e-pin scenario, it is found that the amount of energy spent on the outer rim 11 is zero, while the energy absorbed by the outer ring of burls 10 is only 25% of the energy generated by 12 N, indeed the energy is quadratic in relation to the force applied. A series of adaptations was calculated, wherein, among others, parameters were varied such as the height of the outer rim, the presence of a protective rim element 13, and applied force.

The results are summarized in the following table:

| Description of design | Estimated wear energy [fraction of 2.05 uJ] (for a 0.2 friction coefficient) | | | |
| --- | --- | --- | --- | --- |
| | Outer burl ring | Sealing rim | Protective rim | Total |
| 12 N E-pin force, sealing rim 5 um lowered, | 84% | 16% | — | 100% |
| 6 N E-pin force, sealing rim 1 um lowered, | 25% | 0% | — | 25% |
| 12 N E-pin force, sealing rim 1 um lowered, | 35% | 65% | — | 100% |
| Protective rim, 1 um lowered, 3 mm outside last burl | 12% | — | 88% | 100% |

From this table, it is apparent that a number of design steps can be taken in order to release said substrate from said holder with a release force acting on the substrate holder, more specifically on the holding region for holding the wafer in a flat position, that is reduced prior to final release. In a practical production process, said release forces and/or said release heights may be determined in-process in an iterative way. In this way, in a high-throughput photolithographic process, the amount of releasing force to be applied to the wafer can be easily and quickly found without causing unnecessary damage to the wafer holder. Furthermore, said release force and/or said release height may be determined based on recently in-process applied release forces and/or release heights. For example, in a batch process, wherein a batch of wafers is ejected from the wafer holder in a subsequent photolithographic process, the method may comprise an ejection routine that ejects the wafers based on the average release force of the last recent results. Such recent results, for example, a statistical averaging of the last ten results, will offer the best heuristic values, while keeping the damage to the wafer to a minimum. In this way, only exceptionally will a more than average release force have to be applied in a subsequent iterative step, for example a preset maximum release force, in order to release a wafer that is clamped to the wafer holder with a more than average clamping force, for instance, due to sticking or other non-average circumstances.

In this way, the average excess friction energy applied during release of the wafer can be lowered for batch processes, thus reducing the wear on the substrate holder significantly.

While specific embodiments of the invention have been described above, it will be appreciated that the invention may be practiced otherwise than as described. The description is not intended to limit the invention.

We claim:

1. A lithographic projection apparatus comprising:
a support structure for supporting a patterning device, said patterning device serving to pattern a beam of radiation according to a desired pattern to form a patterned beam;
a substrate holder for holding a substrate, said substrate holder comprising a clamp configured to provide a holding force for pressing said substrate against said substrate holder;
a releasing structure constructed and arranged to apply a release force to release said substrate from said substrate holder against said holding force;
a projection system for projecting said patterned beam onto a target portion of said substrate; and
a controller configured to control application of the release force such that a force acting on said substrate is reduced prior to final release of said substrate from said substrate holder.

2. A lithographic projection apparatus according to claim 1, wherein said controller controls said release force such that said release force at final release is less than 70% of a maximum release force.

3. A lithographic projection apparatus according to claim 2, wherein said controller controls said release force relative to a preset release height of said releasing structure.

4. A lithographic projection apparatus according to claim 1, wherein said release force is chosen so as to generate a maximum angle of deflection of 2 mrad.

5. A lithographic projection apparatus according to claim 3, wherein said predetermined release height for a 200 mm substrate is smaller than 1.0 mm.

6. A lithographic projection apparatus according to claim 1, wherein said substrate holder comprises a protective rim for absorption of wear energy.

7. A lithographic projection apparatus according to claim 1, wherein said substrate holder comprises a plurality of protrusions, each of said plurality of protrusions having an extremity, said extremities of said plurality of protrusions defining a substantially flat plane of support for supporting a substantially flat substrate.

8. A lithographic projection apparatus comprising:
a support structure for supporting a patterning device, said patterning device serving to pattern beam of radiation according to a desired pattern to form a patterned beam;
a substrate holder for holding a substrate said substrate holder comprising a clamp to provide a holding force for pressing said substrate against said substrate holder;
a releasing structure constructed and arranged to apply a release force to release said substrate from said substrate holder against said holding force; and
a projection system for projecting said patterned beam onto a target portion of said substrate,
wherein said substrate holder comprises a protective rim for absorption of excess energy upon final release of said substrate.

9. A method of a manufacturing device comprising:
providing a substrate that is at least partially covered by a layer of radiation-sensitive material;
providing a holding force for pressing the substrate against a substrate holder;
providing a projection beam of radiation using a radiation system;
using a patterning device to endow the projection beam with a pattern in its cross-section to form a patterned beam of radiation;
projecting the patterned beam of radiation onto a target portion of the layer of radiation-sensitive material;
applying a release force so as to release the substrate from the substrate holder against the holding force; and
controlling the application of the release force so as to apply the release force in a manner such that a force acting on said substrate is reduced prior to final release of said substrate from said substrate holder.

10. A method according to claim 9, further comprising:
controlling the application of the release force relative to a preset release height of a releasing structure used to apply said release force.

11. A method according to claim 10, wherein one or both of the release force and the release height are determined in-process in an iterative way.

12. A method according to claim 10, wherein one or both of the release force and the release height are determined based on one or both of recently in-process applied release forces and release heights.

13. A method of a manufacturing device comprising:
providing a substrate that is at least partially covered by a layer of radiation-sensitive material;
providing a holding force for pressing the substrate against a substrate holder;
providing a projection beam of radiation using a radiation system;
using a patterning device to endow the projection beam with a pattern in its cross-section to form a patterned beam of radiation;
projecting the patterned beam of radiation onto a target portion of the layer of radiation-sensitive material;
applying a release force so as to release the substrate from the substrate holder against the holding force;
determining one or both of the release force and a release height in-process in an iterative way; and
controlling the application of the release force so as to apply the release force in a manner such that a force acting on said substrate is reduced prior to final release of said substrate from said substrate holder.

14. A method according to claim 13, wherein one or both of the release force and the release height are determined based on one or both of the recently in-process applied release forces and release heights of a release structure used to apply the release force.

15. A method according to claim 13, wherein, in a batch process, a batch of substrates are ejected from the substrate holder in a subsequent lithographic process, the method comprising an ejection routine that ejects the substrates based on the average release force of most recent results.

16. A method according to claim 13, wherein a statistical averaging of at last predetermined number of release forces is used to determine a subsequent release force.

17. A method according to claim 16, wherein a more than average release force is application in a subsequent iterative step.

18. A method according to claim 17, wherein said more than average release force is a preset maximum release force.

19. A method according to claim 13, further comprising absorbing excess energy during final release of said substrate using a protective rim of said substrate holder.

* * * * *